US008832511B2

(12) United States Patent
Chen et al.

(10) Patent No.: US 8,832,511 B2
(45) Date of Patent: Sep. 9, 2014

(54) BUILT-IN SELF-TEST FOR INTERPOSER

(75) Inventors: Ji-Jan Chen, Hsinchu (TW); Nan-Hsin Tseng, Tainan (TW); Chin-Chou Liu, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 452 days.

(21) Appl. No.: 13/209,477

(22) Filed: Aug. 15, 2011

(65) Prior Publication Data
US 2013/0047049 A1   Feb. 21, 2013

(51) Int. Cl.
*G01R 31/28*   (2006.01)

(52) U.S. Cl.
USPC .......................................................... 714/733

(58) Field of Classification Search
CPC ................... G01R 1/31813; G01R 31/318385; G01R 31/3187; G01R 31/318513; G01R 31/2889; G06F 11/27; H01L 2225/06596; H01L 2225/1058; H01L 25/0657; H01L 43/50; H04L 43/50
USPC ......... 714/733, 734, 738, 739, 781, 799, 736, 714/E11.169; 365/201; 324/754.18, 754.07, 324/762.03
See application file for complete search history.

(56) References Cited

U.S. PATENT DOCUMENTS

| | | | |
|---|---|---|---|
| 6,272,653 B1 * | 8/2001 | Amstutz ........................ 714/724 |
| 6,442,724 B1 * | 8/2002 | Augarten ....................... 714/738 |
| 6,769,081 B1 * | 7/2004 | Parulkar ........................ 714/733 |
| 7,027,349 B2 * | 4/2006 | Ryan et al. ............... 365/230.03 |
| 7,522,538 B2 | 4/2009 | Rhim et al. |
| 7,537,960 B2 * | 5/2009 | Kelly et al. .................... 438/107 |
| 7,577,885 B2 * | 8/2009 | Hasegawa et al. ............ 714/718 |
| 7,795,894 B1 * | 9/2010 | Sogani ........................ 324/750.3 |
| 7,797,591 B2 * | 9/2010 | Hasegawa et al. ............ 714/710 |
| 7,826,460 B2 | 11/2010 | Lee |
| 7,945,827 B1 * | 5/2011 | Briggs ........................... 714/724 |
| 8,122,312 B2 * | 2/2012 | Floyd et al. .................... 714/733 |
| 2003/0076734 A1 * | 4/2003 | Ryan et al. ..................... 365/233 |
| 2009/0072240 A1 | 3/2009 | Suh et al. |
| 2009/0282285 A1 * | 11/2009 | Hasegawa et al. ................ 714/7 |
| 2010/0332177 A1 | 12/2010 | Wu et al. |
| 2011/0012633 A1 | 1/2011 | Rahman et al. |
| 2012/0056191 A1 | 3/2012 | Endo et al. |
| 2012/0273955 A1 * | 11/2012 | Or-Bach et al. ............... 257/762 |
| 2012/0319717 A1 * | 12/2012 | Chi .......................... 324/756.05 |

OTHER PUBLICATIONS

"IEEE Standard Test Access Port and Boundary-Scan Architecture", IEEE Std 1149.1™-2001 (R2008), (Revision of IEEE Std 1149.1-1990), The Institute of Electrical and Electronics Engineers, Inc., New York, NY, 2001, 208 pages.

"Design for Test", from Wikipedia, 2011, 4 pages, http://en.wikipedia.org/wiki/Design_for_test.

(Continued)

*Primary Examiner* — Phung M Chung
(74) *Attorney, Agent, or Firm* — Duane Morris LLP

(57) ABSTRACT

A device includes a first die coupled to an interconnect structure of an interposer. The first die includes a first BIST circuit configured to generate and output test signals to the interconnection structure of the interposer. A second die is coupled to the interconnect structure of the interposer and includes a second BIST circuit configured to receive signals from the interconnection structure of the interposer in response to the first BIST circuit transmitting the test signals. The second BIST circuit is configured to compare the signals received from the interconnection structure of the interposer to reference signals generated by the second BIST circuit.

24 Claims, 11 Drawing Sheets

(56) References Cited

OTHER PUBLICATIONS

"IEEE Standard Testability Method for Embedded Core-based Integrated Circuits", IEEE Std 1500™-2005, IEEE Computer Society, Sponsored by the Test Technology Technical Council, The Institute of Electrical and Electronics Engineers, Inc., New York, NY, 127 pages.

"Scan Chain", from Wikipedia, 2011, 1 page, http://en.wikipedia.org/wiki/Scan_chain.

* cited by examiner

US 8,832,511 B2

BUILT-IN SELF-TEST FOR INTERPOSER

FIELD OF DISCLOSURE

The disclosed system and method relate to integrated circuits. More specifically, the disclosed system and method relate to testing dies stacked on an interposer.

BACKGROUND

Integrated circuits ("ICs") are incorporated into many electronic devices. IC packaging has evolved such that multiple ICs may be vertically joined together in so-called three-dimensional ("3D") packages in order to save horizontal area on a printed circuit board ("PCB"). Another packaging method, referred to as 2.5D IC packages, may use an interposer, which may be formed from a semiconductor material such as silicon, for coupling one or more dies to a PCB. Interposers affect the operating characteristics of the ICs that are bonded or otherwise coupled to the interposer due to the resistance and capacitance ("RC") of the semiconductor substrate. However, memory and logic testing of 2.5D ICs can be costly and inefficient, involving a large area on the IC chip as well as external equipment to generate the testing signals.

DETAILED DESCRIPTION

Improved built-in self-test ("BIST") circuits and methods for an interposer are disclosed that advantageously enable reduced testing time by reducing the time of the tester programming and number of shifts-in and shifts-out. Additionally, the BIST circuits and methods reduce the amount of area overhead required for the testing circuitry as well as reduce the speed degradation experienced by conventional 2.5D IC test circuits.

Figure 1:
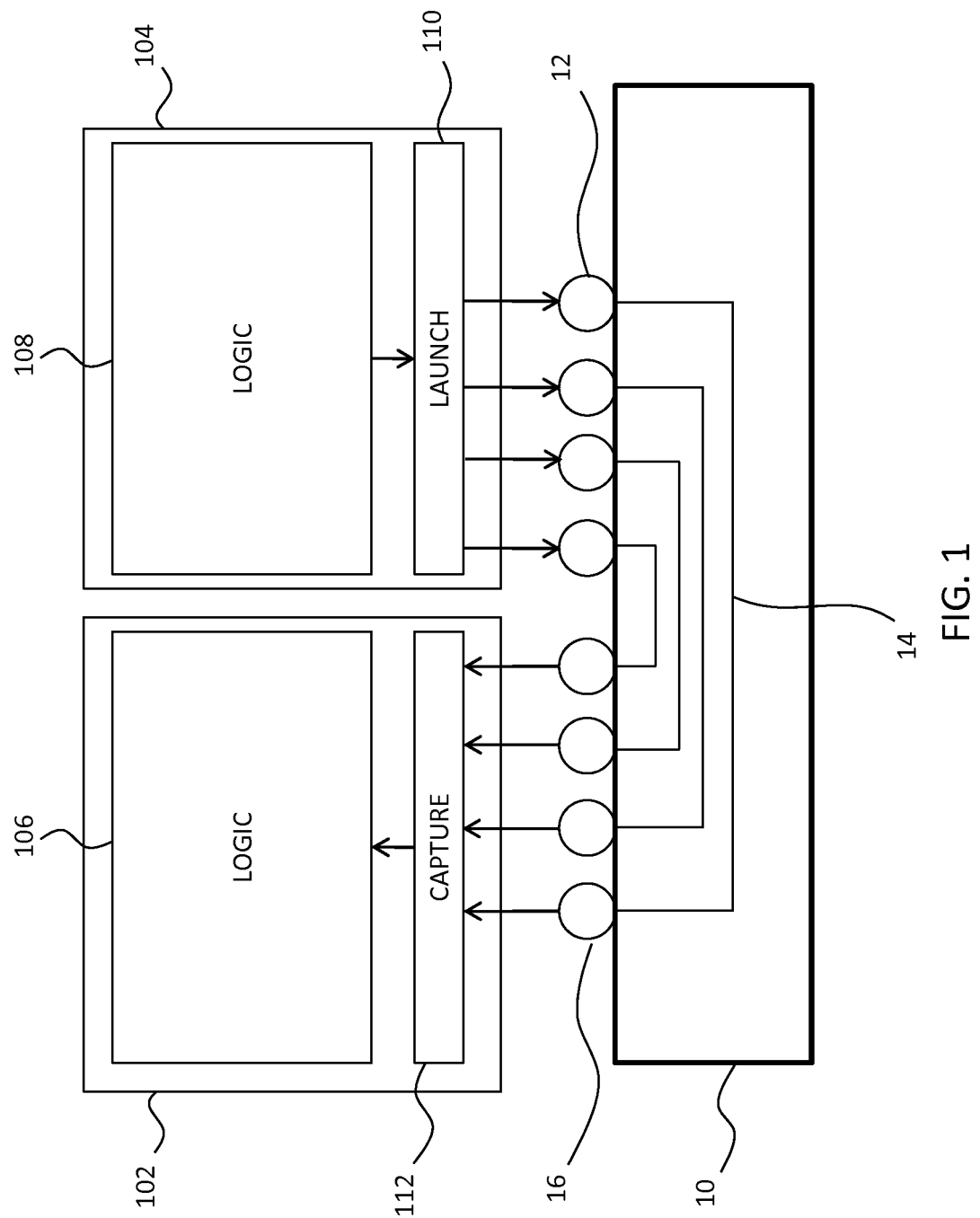
FIG. 1 is one example of a functional block diagram of a pair of dies configured with built-in self-test circuitry for performing known-good stack testing of an interposer.

FIG. 1 is a block diagram of a semiconductor interposer 10 (e.g., a silicon interposer) coupled to a first die 102 and a second die 104. Each of the first and second dies 102, 104 include internal logic circuitry 106, 108 configured to perform one or more functions. For example, the logic of one die may be configured to perform global positioning and the other die may be configured to store data for the GPS die. One skilled in the art will understand that the internal logic circuitry may be configured to perform a wide variety of functions. Dies 102, 104 may be formed using the same processing technology, e.g., a technology set forth by the International Technology Roadmap for Semiconductors ("ITRS"), or dies 102, 104 may be formed using different processing technology.

Each die 102, 104 also includes built-in self-test ("BIST") circuitry 110, 112. In some embodiments, BIST circuitry 110 is configured to generate test signals ("launch circuitry"), which are transmitted to interposer 10 via conductive bumps ("µbumps 12"), and BIST circuitry 112 is configured to receive signals from µbumps 16 and interposer 10 ("capture circuitry") in response to launch circuitry 110 transmitting test signals. As will be understood by one skilled in the art, interposer 10 includes conductive traces and vias 14 that provide interconnections for routing signals received from dies 102, 104 between µbumps 12 and 16.

Figure 2:
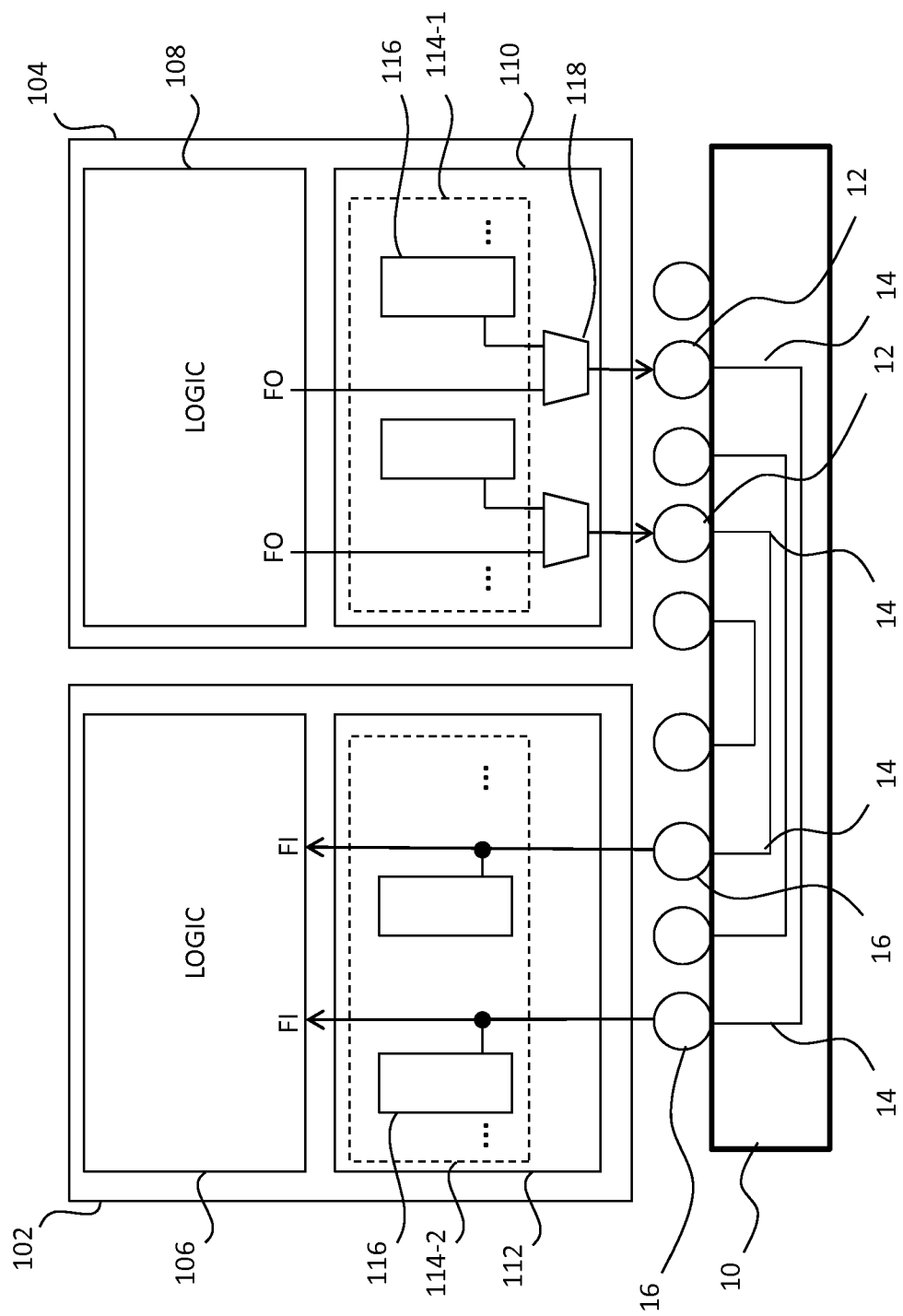
FIG. 2 is a functional block diagram of launch and capture circuitry that include configurable linear feedback shift registers.

In one embodiment, such as the embodiment illustrated in FIG. 2, launch circuitry 110 includes a configurable linear feedback shift register ("CLFSR") 114-1 that includes a plurality of shift registers or latches 116. The output terminal of each shift register 116 is coupled to a respective multiplexer ("mux") 118, which has its output coupled to a µbump 12. Each mux also receives a function output ("FO") from internal logic circuitry 108 and is configured to selectively output either the FO from logic circuitry 108 or a test signal from shift register 116 to a respective µbump 12. In some embodiments, the mux selection signal is controlled by a "Test Enable" signal, Test_Enable, provided by a test device or an internal controller. The functional output and test signal from a shift register are selected by Test_Enable during normal operating mode and test mode, respectively.

Capture circuitry 112 also includes a CLFSR 114-2 having a plurality of shift registers 116. Each shift register 116 of capture circuitry 112 is configured to receive a signal from a respective µbump 16 of interposer 10. The signal received from the respective µbump 16 is also provided to internal function logic 106 of die 102 as a function input ("FI").

Figure 3A:
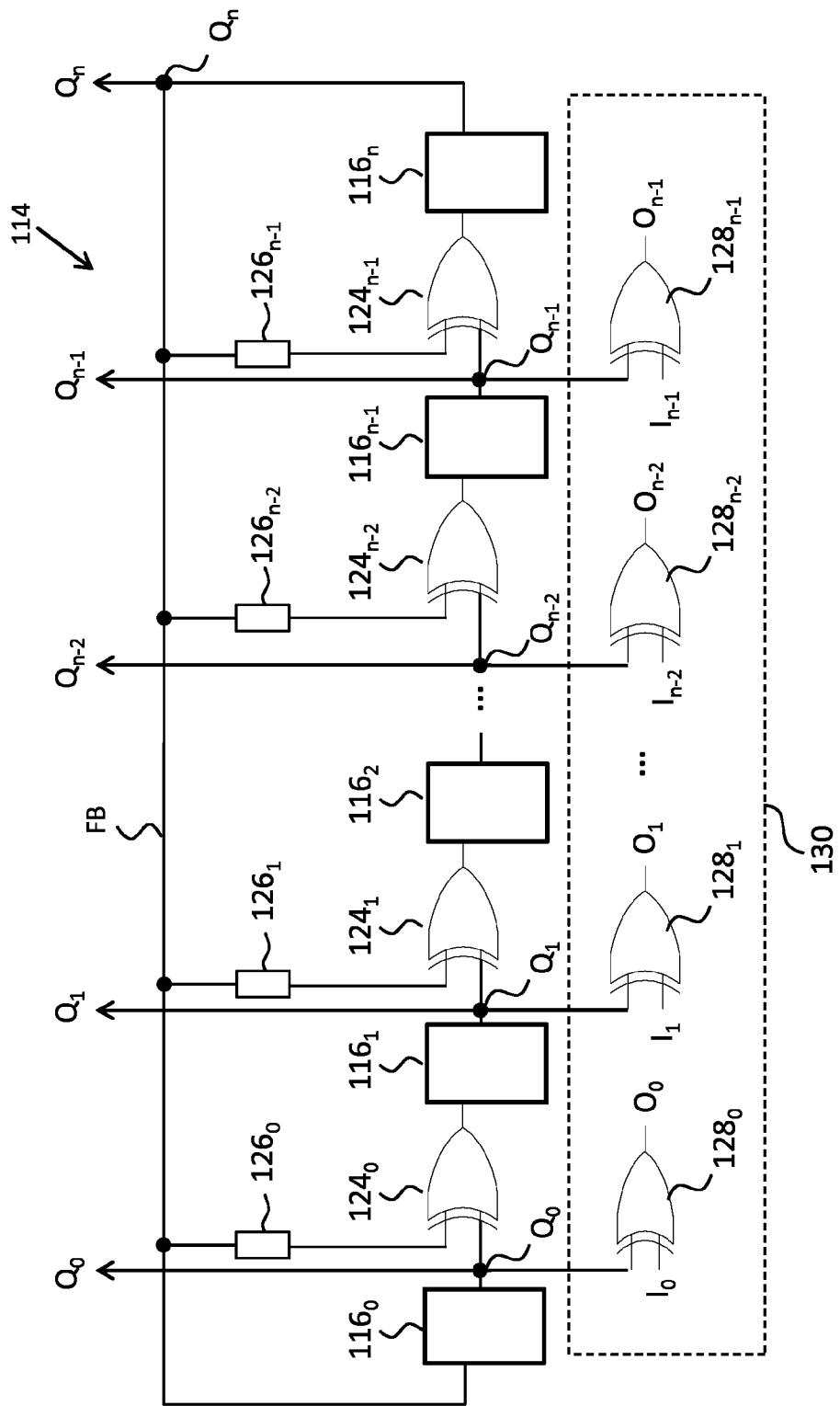
FIG. 3A illustrates one example of a configurable linear feedback shift register.

FIG. 3A illustrates one example of a CLFSR 114. As shown in FIG. 3A, each latch 116 of CLFSR 114 has a respective output, which is provided to a node Q. Node Q is coupled to an input of a mux 118 shown in FIG. 2 and to an input of another latch 116 through a logic gate 124. For example, latch $116_0$ has its output coupled to node $Q_0$, which is configured to provide a first output to a mux 118 (not shown in FIG. 3A) and to an input of logic gate $124_0$. Although logic gates 124 are illustrated as XOR gates, one skilled in the art will understand that other logic gates may be used such as, for example, AND gates, NOR gates, OR, gates, and NAND gates, to list a few possibilities. Latch 116 may be implemented as a flip-flop such as, for example, an RS flip-flop, a D flip-flop, a JK flip-flop, or other latch as will be understood by one skilled in the art.

Logic gate $124_0$ has a second input coupled to a configurable device 126, which is coupled to feedback line FB. In some embodiments, configurable device 126 may be one-time configurable device such as an electronic fuse ("efuse") or other type of fuse. In some embodiments, configurable device may be repeatedly configurable device such as a resistor, a look-up table or content-addressable memory, a shift register, or other device that may be configured to provide different inputs to logic gate 124.

Figure 3B:
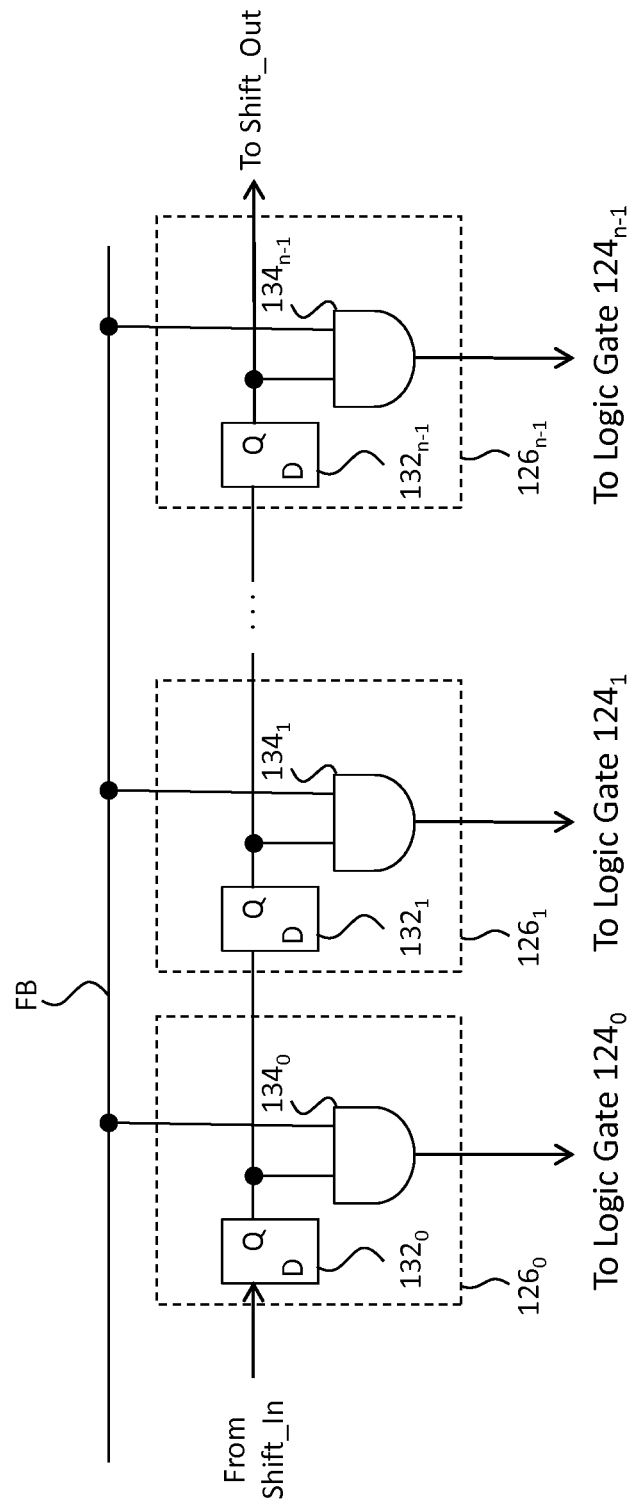
FIG. 3B illustrates one example of a configurable device in accordance with the configurable linear feedback shift register illustrated in FIG. 3A.

For example, FIG. 3B illustrates one embodiment of a plurality of configurable devices 126 in accordance with FIG. 3A. Each configurable device 126 includes a latch 132, such as a flip-flop, and a logic gate 134, which may be an AND gate, a NAND gate, or other logic gate. Latches $132_0$-$132_{n-1}$ are serially connected with one another such that the output of one latch, e.g., latch $132_0$, is provided to the input of an adjacent latch, e.g. latch $132_1$. The first latch in the series of latches, e.g., latch $132_0$, may be coupled to a Shift_In pin of a test device (not shown), and the last latch in the series of latches, e.g., latch $132_{n-1}$, may be coupled to a Shift_Out pin of a test device (not shown).

The output of each of the latches 132 is also coupled to an input of a respective logic gate 134. For example, the output of latch $132_0$ is coupled to the input of logic gate $134_0$ as well as to the input of latch $132_1$. A second input of each of the logic gates 134 is coupled to feedback line FB, and each of the outputs of logic gates 134 is coupled to an input of a respective logic gate 124 as best seen in FIG. 3A. For example, the output of logic gate $134_0$ of configurable device $126_0$ is provided to an input of logic gate $124_0$.

When a logic one is provided to the input of a latch 132, the output of the corresponding logic gate 134 is equalized to the value of line FB. For example, if a latch 132 outputs a logic one and line FB is at a logic one, then the output of the corresponding logic gate 134 is a logic one. If the output of a latch 132 is a logic one and line FB is at a logic zero, then the output of the corresponding logic gate 134 is a logic zero. If the output of a latch 132 is a logic zero, then the output of the corresponding logic gate 134 is a logic zero.

Referring again to FIG. 3A, the output of logic gate $124_0$ is coupled to an input of latch $116_1$, which has its output coupled to another logic gate $124_1$ and to a mux 118 (not shown). The number of latches 116 and logic gates 124 of CLFSR 114 may be varied depending on the number of functional outputs and inputs of dies 102, 104 as will be understood by one skilled in the art.

The output of the last latch $116_n$ of the CLFSR 114, which is coupled to node $Q_n$, is coupled to line FB. Line FB provides a feedback signal to each of the logic gates 124 through configurable devices 126. Line FB also is used as an input to the first latch $116_0$ in the series of latches 116 of the CLFSR 114.

Each of the Q nodes of CLFSR 114 are also connected to a respective input of a respective second logic gate 128. Logic gates 128 form a comparator 130 for comparing the signals received at the Q nodes to signals received from interposer 10, i.e., signals received at nodes $I_0, I_1, \ldots, I_{n-1}$. For example, the output of each logic gate 128 may be used to identify if a reference signal received at one input of the logic gate 128 matches a signal received from a μbump 16 and interposer 10 in response to interposer 10 receiving testing signals from launch circuitry 110. In some embodiments, when logic gates 128 are implemented as XOR gates, the output of an XOR gate will be a logic zero when the inputs of the XOR gate match, i.e., are both logic ones or logic zeros, and will be a logic one when the inputs of the XOR differ, i.e., one is a logic one and the other input is a logic zero.

The output of each logic gate 128 may be provided to a terminal or node, $O_0, O_1, \ldots O_{n-1}$, for connecting to test instrumentation (not shown) such that the interconnection between dies 102, 104 and interposer 10 may be tested. In some embodiments, comparator 130 may included in, but not be used by, the CLFSR 114 on the launch side 110. In some embodiments, the CLFSR 114 of the launch side 110 does not include a comparator 130. One skilled in the art will understand that launch and capture circuitry 110, 112 of dies 102, 104 may include each of the devices shown in FIG. 3A such that capture circuitry 112 may be configured as launch circuitry 110 and launch circuitry 110 may be configured as capture circuitry 112.

Figure 3C:
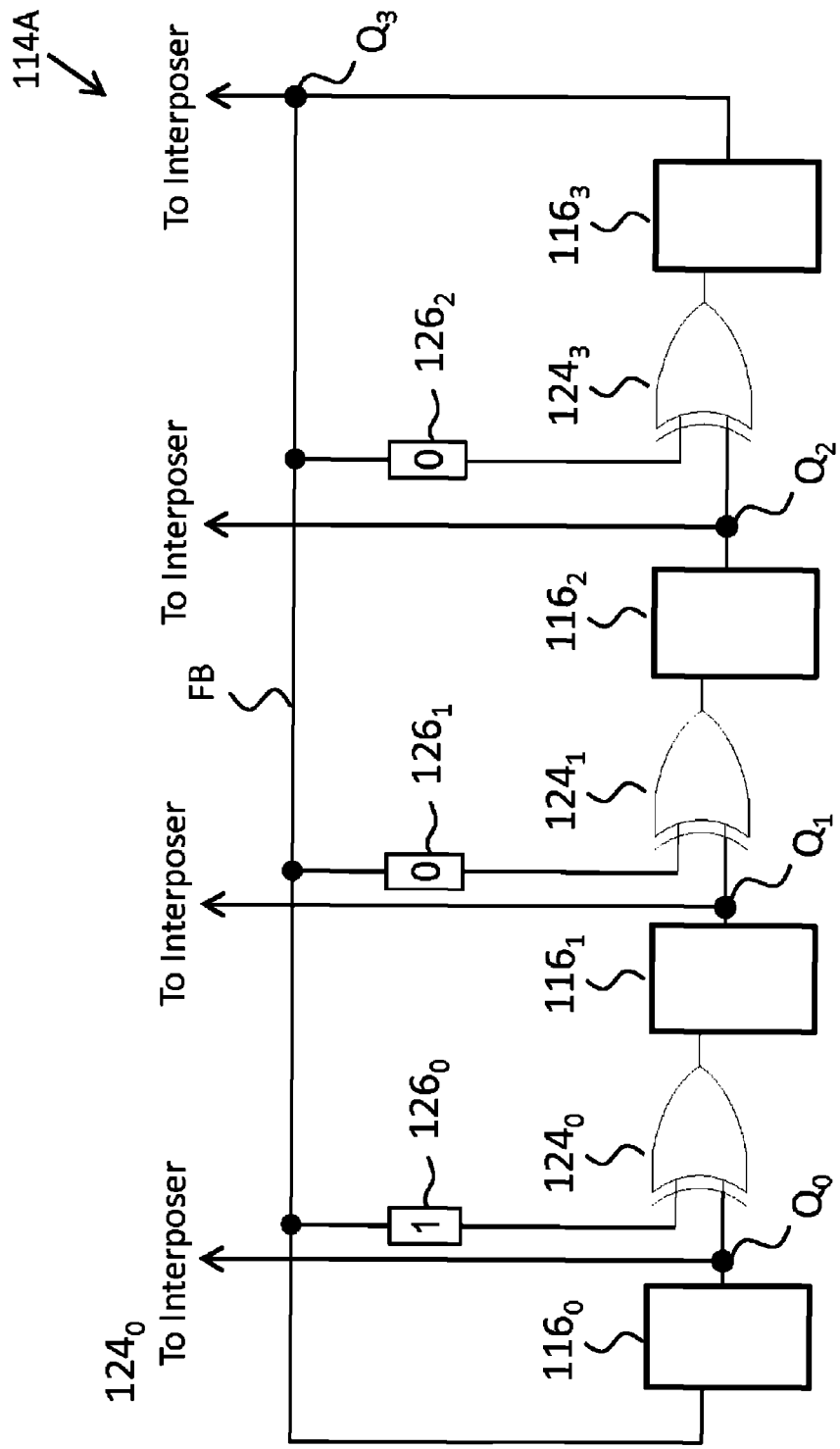
FIG. 3C illustrates one example of a four-bit configurable linear feedback shift register for generating testing signals.

For example, FIG. 3C illustrates a four bit implementation of a CLFSR 114A for a characteristic polynomial $X^4+X^1+1$. As shown in FIG. 3C, latch $116_0$ receives the output of latch $116_3$ at its input and has its output coupled to node $Q_0$, which is coupled to a μbump 12 of an interposer 10 (not shown). Node $Q_0$ is also coupled to an input of logic gate $124_0$, which has a second input coupled to line FB through configurable device $126_0$. Under the $X^4+X^1+1$ characteristic polynomial, configurable device $126_0$ is configured to provide the logic value to the input of logic gate $124_0$, and its output value depends on the value of FB, which is based on $Q_3$. For example, configurable device $126_0$ provides a logic one if the value of $Q_3$ is a logic one and provides a logic zero if the value of $Q_3$ is a logic zero.

The output of logic gate $124_0$ is connected to the input of latch $116_1$, which has its output coupled to the input of logic gate $124_1$. Under the $X^4+X^1+1$ characteristic polynomial, the second input of logic gate $124_1$ is zero due to the output of configurable device $126_1$. As described above, latch $132_1$ may output a logic zero to logic gate $134_1$ such that logic gate $134_1$ outputs a logic zero to the input of logic gate $124_1$ regardless of the logical state of line FB. Configurable device $126_2$ is also configured to output a logic zero to an input of logic gate $124_3$. Comparator 130, including logic gates 128, is not shown in FIG. 3B to simplify the figure since the comparison function may not be performed on the launch side.

Figure 3D:
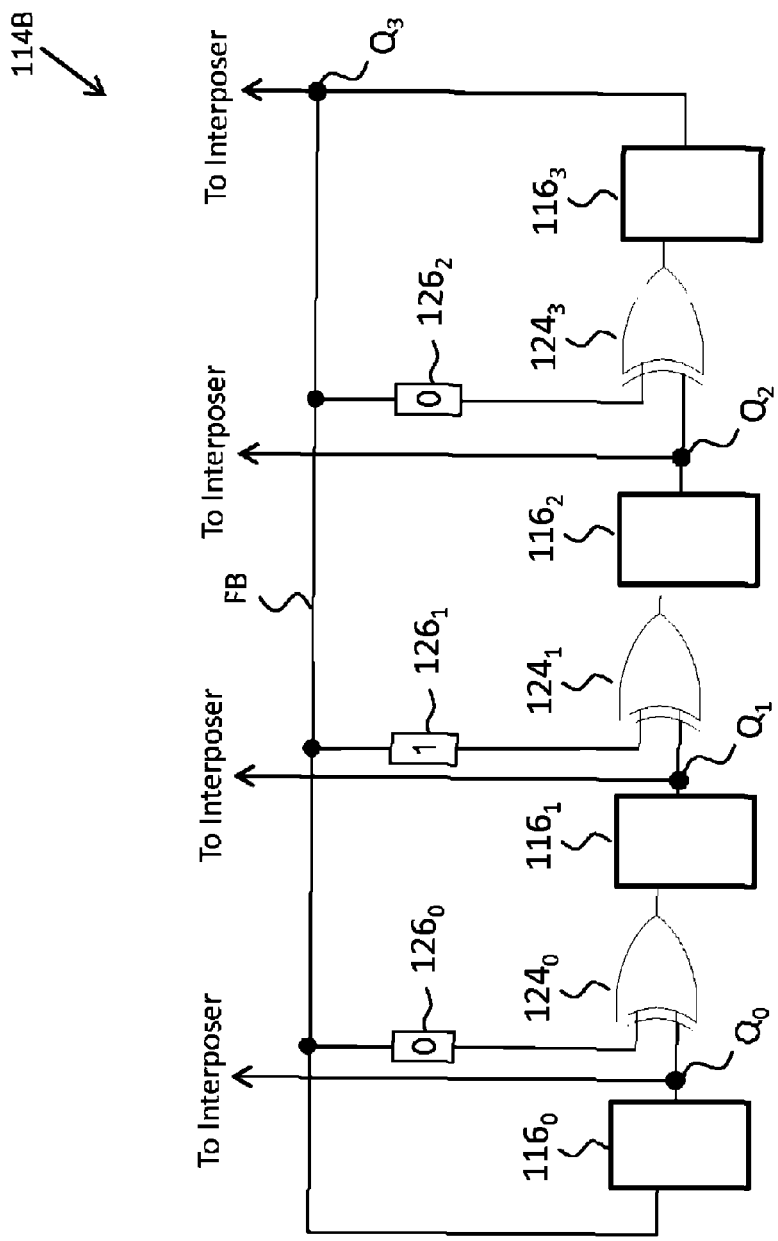
FIG. 3D illustrates another example of a four-bit configurable linear feedback shift register for generating testing signals.

As described above, configurable devices 126 of CLFSR 114 may be configured or adjusted to provide test signals for testing a different polynomial test pattern. For example, FIG. 3D illustrates a four-bit CLFSR 114B configured to generate test signals for the polynomial $X^4+X^2+1$. As shown in FIG. 3C, configurable devices $126_0$ and $126_2$ are configured such that the inputs of logic gates $124_0$ and $124_2$ receive logic zeroes from configurable devices $126_0$ and $126_2$, and configurable device $126_1$ is configured such that it provides the logic state of line FB to an input of logic gate $124_1$. One skilled in the art will understand that CLFSR may be configured to test any number of bits and polynomials.

Figure 3E:
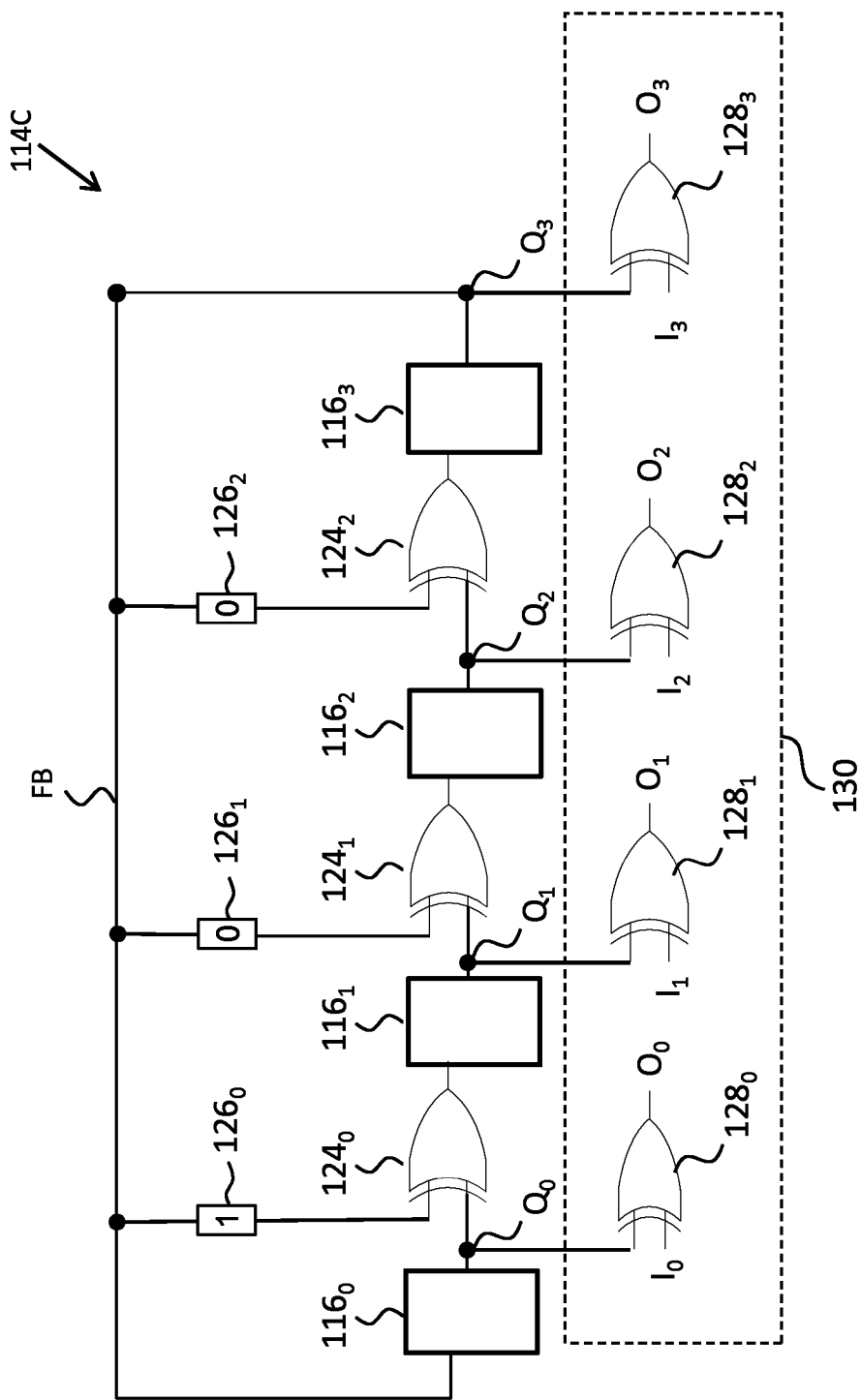
FIG. 3E illustrates one example of a four-bit configurable linear feedback shift register for capture circuitry generating reference signals and comparing them to signals received from launch circuitry of FIG. 3C.

FIG. 3E illustrates an embodiment of a CLFSR 114C configured as a capture circuit for receiving four bits from CLFSR 114A illustrated in FIG. 3B. As shown in FIG. 3E, CLFSR 114C includes four latches $116_0$-$116_3$ each configured to output a respective signal to nodes $Q_0$-$Q_3$ in response to an input signal. For example, the input of latch $116_0$ is coupled to node $Q_3$, which receives an output signal from latch $116_3$ at its input. Latch $116_0$ outputs a signal to node $Q_0$, which is coupled to the input of logic gate $124_0$ and to the input of logic gate $128_0$ of comparator 130.

Logic gate $128_0$ of comparator 130 also receives a test data signal from node $I_0$, which is coupled to a μbump 12 of interposer 10 to transmit a signal generated by a launch CLFSR (i.e., launch CLFSR 114-1 in FIG. 2 or launch CLFSR 114A in FIG. 3C). Configurable devices $126_0$-$126_2$ may be configured in the same manner as the configurable devices of the CLFSR in the capture side such that the signals at nodes $Q_0$-$Q_3$ on the capture side match the signals at nodes $Q_0$-$Q_3$ on the launch side. For example, configurable device $126_0$ is configured to output the logical state of line FB to logic gate $124_0$, configurable device $126_1$ is configured to output a logic zero to logic gate $124_1$, and configurable device $124_2$ is configured to output a logic zero to logic gate $124_2$.

As described above, logic gate $128_0$ compares the signal at node $Q_0$ to the signal at node $I_0$ from interposer 10. Logic gate $128_0$ outputs a signal to node $O_0$ identifying if the signals at its inputs match. For example, if the signal at node $Q_0$ matches the signal at node $I_0$, then logic gate $128_0$ outputs a logic zero to node $O_0$, and if the signal at node $Q_0$ does not match the signal at node $I_0$, then logic gate $128_0$ outputs a logic one to node $O_0$. Node $O_0$ may be coupled to testing circuitry (not shown) configured to receive each of the signals from nodes $O_0$-$O_4$ and generate a report identifying if the connections between the dies and interposer are functioning properly.

Figure 3F:
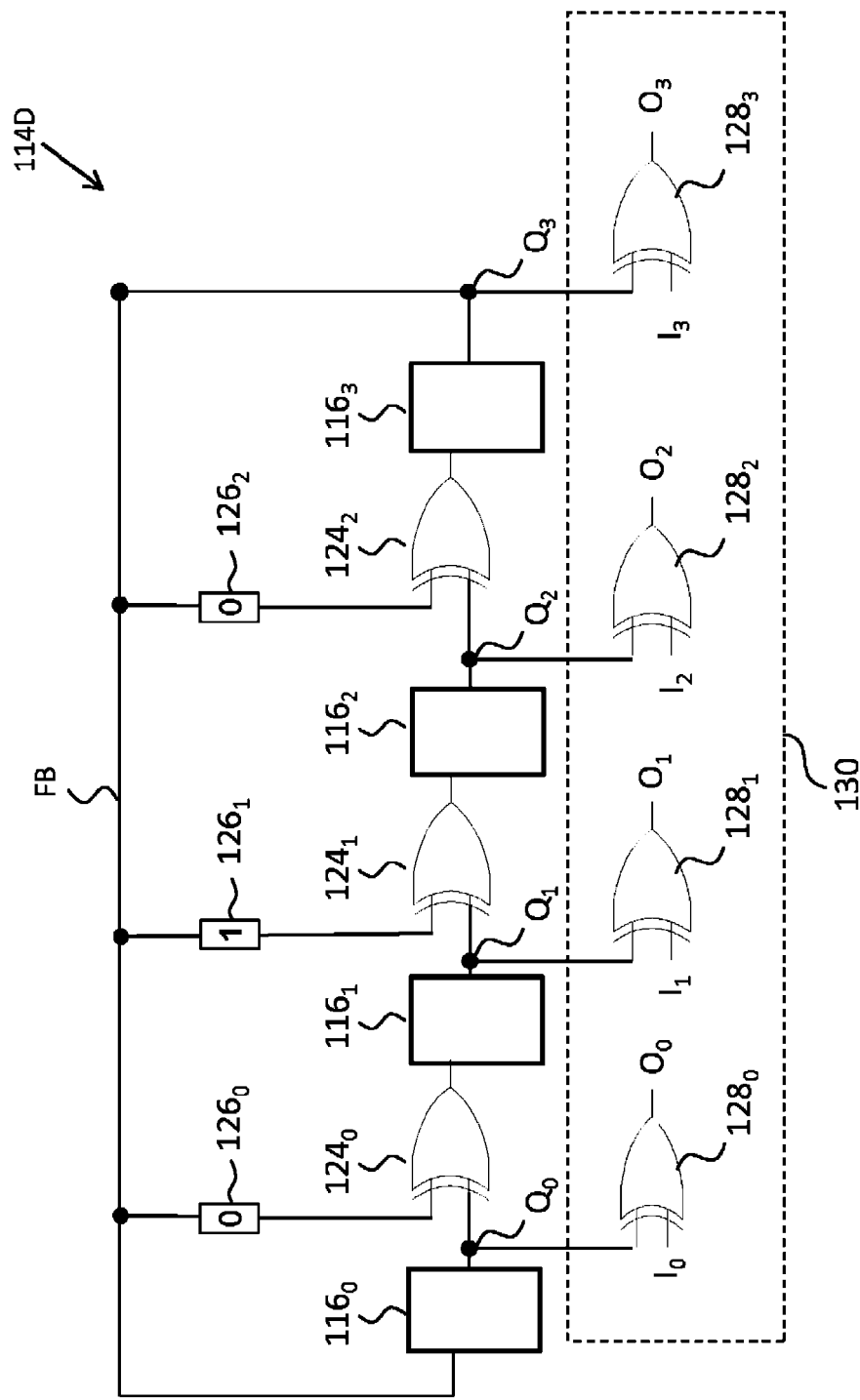
FIG. 3F illustrates one example of a four-bit configurable linear feedback shift register for capture circuitry generating reference signals and comparing them to signals received from launch circuitry of FIG. 3D.

FIG. 3F illustrates an example of a CLFSR 114D configured to capture test signals generated by CLFSR 114B illustrated in FIG. 3D. As shown in FIG. 3F, configurable device $126_1$ of CLFSR 114D is configured to output the logical state of line FB to logic gate $124_1$, and configurable devices $126_0$ and $126_2$ are configured to output logic zeroes to logic gates $124_0$ and $124_2$, as are the corresponding configurable devices of CLFSR 114B. Accordingly, the latches 116 and logic gates 124 of CLFSRs 114B and 114D generate the same signals, e.g., reference signals, at nodes $Q_0$-$Q_3$, which are compared by logic gates $128_0$-$128_3$ of CLFSR 114D.

In some embodiments, dedicated test patterns may be used to test the interconnections between dies and an interposer. For example, a finite state machine ("FSM") may be implemented and configured to provide predetermined testing patterns to the launch side, which are then compared by a comparator coupled to an FSM configured to generate reference signals, which are the same as the test signals, on the capture side.

Figure 4:
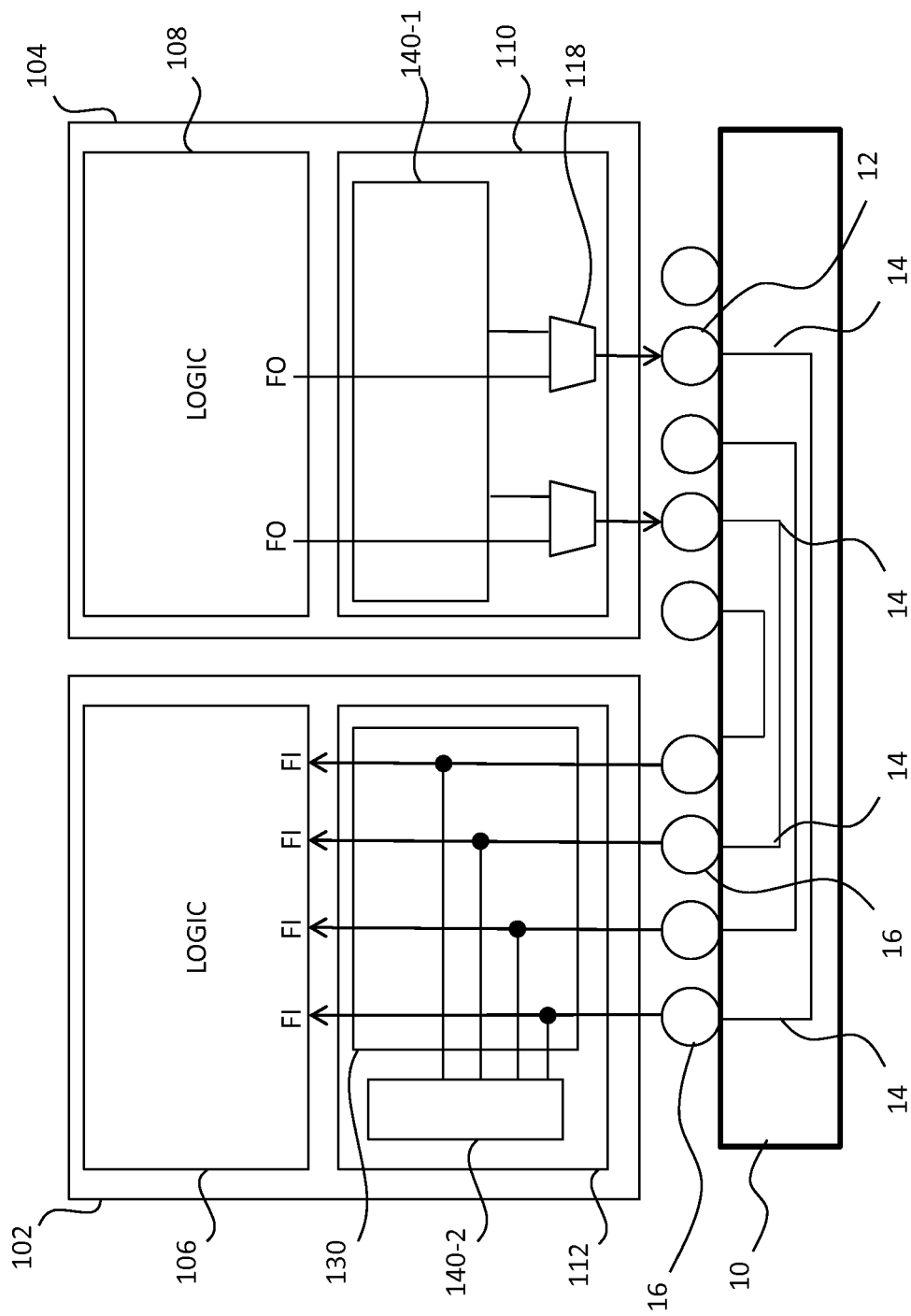
FIG. 4 is a functional block diagram of launch and capture circuitry that include finite state machines.

FIG. 4 illustrates one example of a first die 104 having BIST circuitry configured as launch circuitry 110 and a second die configured with a BIST circuitry configured as a capture circuit 112. As shown in FIG. 4, launch circuit 110 includes an FSM 140-1 configured to output a test pattern to mux 118, which is coupled to μbump 12 for connection to interposer 10. Mux 118 is configured to selectively couple FSM 140-1 or logic block 108 to a μbump 12 based on a control input. Capture circuit 112 includes a comparator 130, which is configured to receive signals from interposer 10 via μbumps 16 and an FSM 140-2. The FIs received from μbumps 16 of interposer 10 are also provided to logic circuitry 106.

FSM 140-1 of launch side 110 is configured to provide test sequences for testing for various faults including, but not limited to, stuck-at-one faults, stuck-at-zero faults, and coupling faults. Stuck-at-one faults may be tested by writing a logic zero to each line connected to FSM 140-1, and stuck-at-zero faults may be tested by writing logic ones to each line connected to FSM 140-1. Coupling faults may be tested by FSM 114-1 generating alternating signals of logic ones and logic zeroes, which are provided to capture circuit 112 via μbumps 12, 16 and conductive lines 14 of interposer 10.

Figure 5:
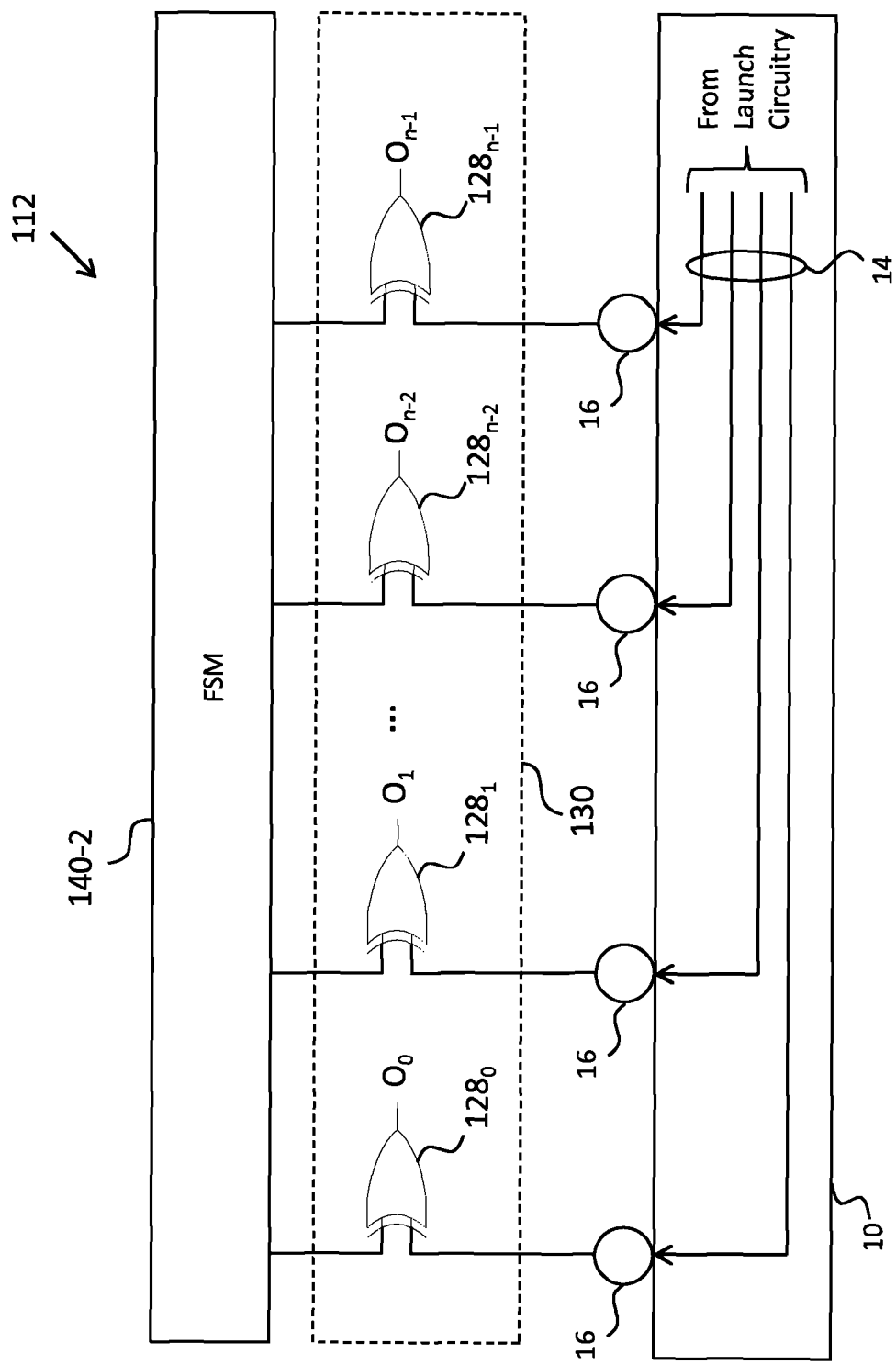
FIG. 5 illustrates one example of capture circuitry that includes a comparator and a finite state machine.

As shown in FIG. 5, FSM 140-2 of capture circuitry 112 generates the same alternating sequence of logic ones and zeros, which it provides to comparator 130. Comparator 130 may include a plurality of logic gates 128 with each logic gate receiving a signal from FSM 140-2 and from launch circuitry 110 via conductive lines 14 and μbumps 16 of interposer 10. As described above, logic gates 128 output signals identifying if the signals received from interposer 10 in response to testing signals transmitted by launch circuitry 110 match reference signals received from FSM 140-2. For example, if the signal received at a logic gate 128 from launch circuitry 110 matches a reference signal received from FSM 140-2, then the logic gate 128 may output a logic zero, and if the signal received from launch circuitry 110 does not match the reference signal from FSM 140-2, then the logic gate 128 may output a logic one.

Figure 6:
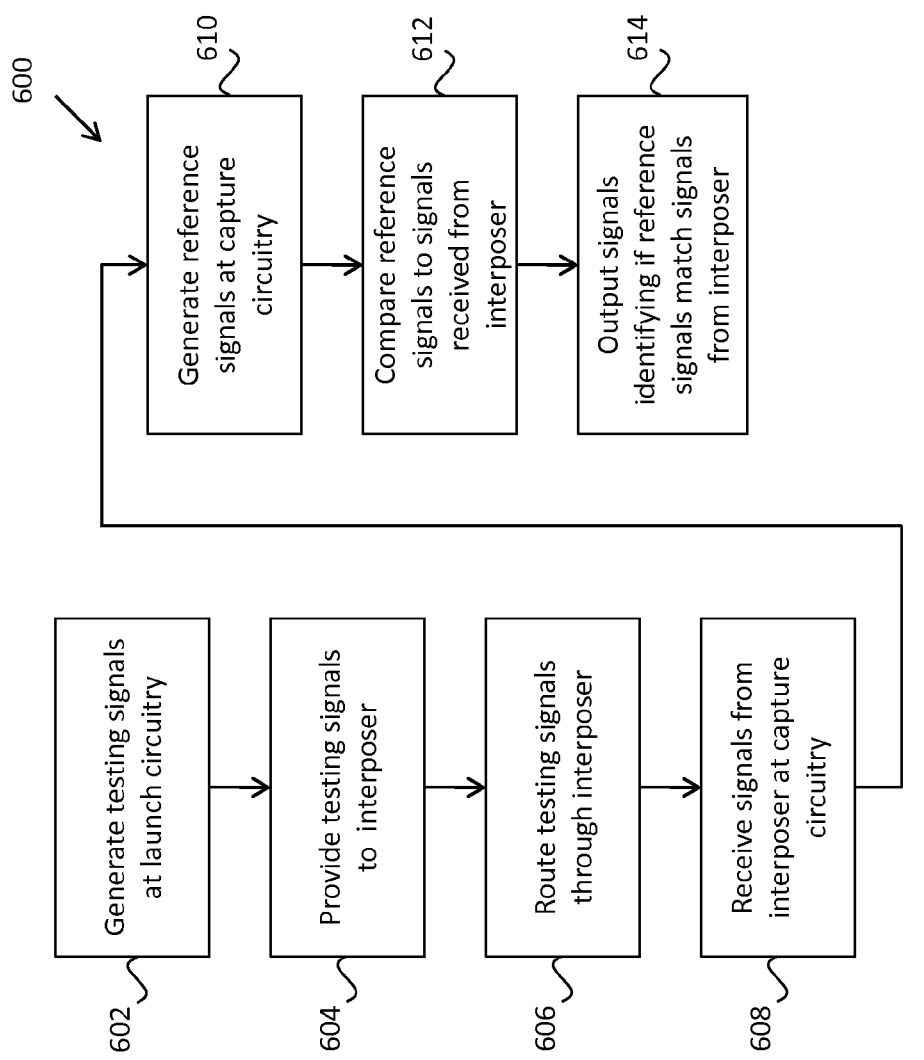
FIG. 6 is a flow diagram of one example of a testing method.

One example of a known-good stack ("KGS") testing operation is described with reference to FIG. 6, which is a flow diagram of a testing method 600. At block 602, testing signals are generated by launch circuitry 110. Testing signals may be generated by a CLFSR 114 or by an FSM 140. The testing signals generated by CLFSR 114 are based on a status of configurable devices 126. For example, if configurable devices 126 are implemented as serial shift latches, then the testing signals may be adjusted by the logic value shifted into each latch. FSM 140 may be programmed to provide different testing signals as will be understood by one skilled in the art. In some embodiments, multiple FSMs 140 may be provided with each FSM configured to generate different testing signals.

At block 604, the testing signals are provided to interposer 10. The testing signals may be provided to interposer 10 via muxes 118 and μbumps 12, which are used to couple die 102 to interposer 10. Muxes 118 may be configured to couple the output of launch circuitry 110 to μbumps 12 instead of FO signals from logic circuitry 108. The testing signals are routed from μbumps 12 to μbumps 16 through interposer 10 at block 606. Conductive lines 14 are used to route signals from the μbumps 12 that are used to couple die 102 to interposer 10 to μbumps 16 that couple die 104 to interposer 10.

At block 608, signals are received at capture circuitry 112 from interposer 10. The signals received from interposer 10 are based on the test signals generated by launch circuitry 110 and are received at comparator 130 of capture circuitry 112. Reference signals are generated by capture circuitry 112 at block 610. The reference signals may be generated by a CLFSR 114 or by a FSM 140 in similar manners as testing signals are generated. For example, a CLFSR 114 may generate reference signals based on a status of configurable devices 126, which may mirror the status of configurable devices 126 of CLFSR 114 of launch circuitry 110 such that the reference signals match the testing signals. FSM 140 of capture circuit 112 may be programmed to provide reference signals that match the testing signal generated by FSM 140 of launch circuit 110.

At block 612, the signals received at capture circuitry 112 from interposer 10 are compared to reference signals. As described above, comparator 130 may include a plurality of logic devices 128 each configured to receive a reference signal at one input and a signal from interposer 10 at a second input. Logic devices 128 output signals identifying if the reference signals match the signals received from interposer 10 at block 614. For example, if the signal received from launch circuitry 110 at a logic gate 128 of comparator 130 matches a reference signal, then the logic gate 128 outputs a logic zero, and if the signal received from launch circuitry 110 via interposer 10 does not match the reference signal, then the logic gate 128 outputs a logic one. The output signals of comparator 130 may be provided to a testing device (not shown) as will be understood by one skilled in the art.

In some embodiments, a device includes first and second dies. The first die is coupled to a interconnection structure of an interposer and includes a first built-in self-test (BIST) circuit configured to output test signals to the interconnection structure of the interposer. The second die is coupled to the interconnection structure of the interposer. The second die includes a second BIST circuit configured to receive signals from the interconnection structure of the interposer in response to the first BIST circuit transmitting the test signals and compare the signals received from the interconnection structure of the interposer to reference signals generated by the second BIST circuit.

In some embodiments, a device includes a semiconductor interposer including an interconnection structure having a plurality of conductive lines. A first die is coupled to the interposer and includes a first BIST circuit configured to generate and output test signals to the interconnection structure of the interposer. A second die is coupled to the interposer and includes a second BIST circuit configured to receive signals from the interconnection structure of the interposer in response to the first BIST circuit transmitting the test signals and compare the signals received from the interconnection structure of the interposer to reference signals generated by the second BIST circuit.

In some embodiments, a method includes generating testing signals at a first built-in self-test (BIST) circuit, transmitting the testing signals from the first BIST to an interconnection structure of an interposer coupled to the first die, and receiving signals from the interconnection structure at a second BIST circuit of a second die coupled to the interposer. The signals received from the interconnection structure are compared to reference signals, a defect is identified if the signals received from the interconnection structure do not match the reference signals.

The improved BIST circuits and testing methods disclosed herein advantageously enable reduced testing time by reducing the time of the tester programming and number of shifts-in and shifts-out. Additionally, the BIST circuits and testing methods reduce the amount of area overhead required for the testing circuitry as well as reduces the speed degradation experienced by conventional test circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A device, comprising:
   a first die coupled to an interconnection structure of an interposer, the first die including a first built-in self-test (BIST) circuit configured to output test signals to the interconnection structure of the interposer; and
   a second die coupled to the interconnection structure of the interposer, the second die including a second BIST circuit configured to
      receive signals from the interconnection structure of the interposer in response to the first BIST circuit transmitting the test signals, and
      compare the signals received from the interconnection structure of the interposer to reference signals generated by the second BIST circuit.

2. The device of claim 1, wherein
   the first BIST circuit includes a first configurable linear feedback shift register configured to generate the test signals, and
   the second BIST circuit includes a second configurable linear feedback shift register configured to generate the reference signals.

3. The device of claim 1, wherein
   the first BIST circuit includes a first finite state machine configured to generate the test signals, and
   the second BIST circuit includes a second finite state machine configured to generate the reference signals and a comparator configured to compare the signals received from the interconnection structure of the interposer to the reference signals.

4. A device, comprising:
   a semiconductor interposer including an interconnection structure comprising a plurality of conductive lines;
   a first die coupled to the interposer and including a first built-in self-test (BIST) circuit, the first BIST circuit configured to generate and output test signals to the interconnection structure of the interposer; and
   a second die coupled to the interposer and including a second BIST circuit configured to
      receive signals from the interconnection structure of the interposer in response to the first BIST circuit transmitting the test signals, and
      compare the signals received from the interconnection structure of the interposer to reference signals generated by the second BIST circuit.

5. The device of claim 4, wherein
   the first BIST circuit includes a first configurable linear feedback shift register configured to generate the test signals, and
   the second BIST circuit includes a second configurable linear feedback shift register configured to generate the reference signals.

6. The device of claim 5, wherein the first configurable linear feedback shift register includes:
   a first latch having an input configured to receive a feedback signal output from a second latch via a feedback line and having an output coupled to a first node, and
   a first logic gate having a first input coupled to the first node and a second input coupled to the feedback line through a first configurable device, the first node coupled to at least one conductive line of the interconnect structure.

7. The device of claim 6, wherein the first configurable device includes:
   a second latch having an input and an output; and
   a second logic gate having a first input coupled to an output of the latch and a second input coupled to the feedback line, an output of the second logic gate coupled to an input of the first logic gate.

8. The device of claim 6, wherein the first configurable linear feedback shift register includes:
   a first plurality of latches each having an input and an output,
   a first plurality of nodes, each of the first plurality of nodes coupled to a respective output of the first plurality of latches and to a respective conductive line of the interconnection structure, and
   a first plurality of logic gates, each of the first plurality of logic gates having an input coupled to a respective one of the first plurality of nodes.

9. The device of claim 8, wherein one of the first plurality of latches has an input coupled to an output of the first latch, and one of the first plurality of logic gates has an output coupled to an input of the second latch.

10. The device of claim 5, wherein the second configurable linear feedback shift register includes:
    a first latch having an input configured to receive a feedback signal output from a second latch via a feedback line and having an output coupled to a first node,
    a first logic gate having a first input coupled to the first node and a second input coupled to the feedback line through a first configurable device, and
    a second logic gate having a third input coupled to the first node and a fourth input coupled to at least one of the conductive lines of the interconnection structure of the interposer.

11. The device of claim 10, wherein the second configurable linear feedback shift register includes:
a first plurality of latches each having an input and an output,
a first plurality of nodes, each of the first plurality of nodes coupled to a respective output of the first plurality of latches,
a first plurality of logic gates, each of the first plurality of logic gates having an input coupled to a respective one of the first plurality of nodes, and
a second plurality of logic gates, each of the second plurality of logic gates having an input coupled to a respective one of the first plurality of nodes and another respective input coupled to at least one conductive line of the interconnection structure.

12. The device of claim 4, wherein
the first BIST circuit includes a first finite state machine configured to generate the test signals, and
the second BIST circuit includes a second finite state machine configured to generate the reference signals and a comparator configured to compare the signals received from the interconnection structure of the interposer to the reference signals.

13. The device of claim 12, wherein the comparator includes a plurality of logic gates, each of the logic gates having a first input coupled to a respective output of the second finite state machine and a second input coupled to at least one conductive line of the interconnect structure.

14. The device of claim 4, wherein the reference signals are the same as the test signals.

15. A method, comprising:
generating testing signals at a first built-in self-test (BIST) circuit;
transmitting the testing signals from the first BIST to an interconnection structure of an interposer coupled to the first die;
receiving signals from the interconnection structure at a second BIST circuit of a second die coupled to the interposer;
comparing the signals received from the interconnection structure to reference signals; and
identifying a defect if the signals received from the interconnection structure do not match the reference signals.

16. The method of claim 15, wherein the testing signals are generated by a first finite state machine and the reference signals are generated by a second finite state machine.

17. The method of claim 16, wherein the signals received from the interconnection structure are compared to the reference signals at a comparator, the comparator comprising a plurality of logic gates, each of the logic gates having a first input coupled to a respective output of the second finite state machine and a second input coupled to at least one conductive line of the interconnect structure.

18. The method of claim 15, wherein the testing signals are generated by a first configurable linear feedback shift register, and the reference signals are generated by a second configurable linear feedback shift register.

19. The method of claim 18, wherein the first configurable linear feedback shift register includes:
a first latch having an input configured to receive a feedback signal output from a second latch via a feedback line and having an output coupled to a first node, and
a first logic gate having a first input coupled to the first node and a second input coupled to the feedback line through a first configurable device, the first node coupled to at least one conductive line of the interconnect structure.

20. The method of claim 19, wherein the first configurable linear feedback shift register includes:
a first plurality of latches each having an input and an output,
a second plurality of nodes, each of the second plurality of nodes coupled to a respective output of the first plurality of latches and to a respective conductive line of the interconnection structure, and
a third plurality of logic gates, each of the third plurality of logic gates having an input coupled to a respective one of the second plurality of nodes.

21. The method of claim 18, wherein the second configurable linear feedback shift register includes:
a first latch having an input configured to receive a feedback signal output from a second latch via a feedback line and having an output coupled to a first node,
a first logic gate having a first input coupled to the first node and a second input coupled to the feedback line through a first configurable device, and
a second logic gate having a third input coupled to the first node and a fourth input coupled to at least one of the conductive lines of the interconnection structure of the interposer.

22. The method of claim 21, wherein the second configurable linear feedback shift register includes:
a first plurality of latches each having an input and an output,
a second plurality of nodes, each of the second plurality of nodes coupled to a respective output of the first plurality of latches,
a third plurality of logic gates, each of the third plurality of logic gates having an input coupled to a respective one of the second plurality of nodes, and
a fourth plurality of logic gates, of the fourth plurality of logic gates having an input coupled to a respective one of the second plurality of nodes and another respective input coupled to at least one conductive line of the interconnection structure.

23. The method of claim 15, further comprising:
generating the reference signals at the second BIST; and
providing the reference signals to a comparator of the second BIST for comparison with the signals received from the interposer.

24. The method of claim 15, wherein identifying the defect includes:
outputting a signal from a comparator identifying that the signals received from the interconnection structure do not match the reference signals.

* * * * *